United States Patent [19]
Almquist et al.

[11] Patent Number: 5,695,707
[45] Date of Patent: *Dec. 9, 1997

[54] THERMAL STEREOLITHOGRAPHY

[75] Inventors: Thomas A. Almquist, San Gabriel; Dennis R. Smalley, Baldwin Park, both of Calif.

[73] Assignee: 3D Systems, Inc., Valencia, Calif.

[21] Appl. No.: 441,709

[22] Filed: May 15, 1995

[*] Notice: The term of this patent shall not extend beyond the expiration date of Pat. No. 5,501,824.

Related U.S. Application Data

[63] Continuation of Ser. No. 337,336, Nov. 9, 1994, abandoned, which is a continuation of Ser. No. 148,544, Nov. 8, 1993, Pat. No. 5,501,824, which is a continuation of Ser. No. 900,001, Jun. 17, 1992, abandoned, which is a continuation of Ser. No. 592,559, Oct. 4, 1990, Pat. No. 5,141,680, which is a continuation-in-part of Ser. No. 182,801, Apr. 18, 1988, Pat. No. 4,999,143.

[51] Int. Cl.⁶ .................. B29C 35/08; B29C 41/02; B29C 41/36
[52] U.S. Cl. .................. 264/401; 264/308; 364/468.27; 425/135; 425/145; 425/147; 425/174.4
[58] Field of Search .................. 264/308, 401; 425/135, 145, 147, 174.4; 156/273.3, 379.6; 427/356, 358, 510, 512, 553, 554, 555, 557, 561; 118/120, 413, 423, 429, 620, 693; 222/55, 146.2; 250/432 R, 492.1; 364/468, 476, 468.27; 395/119

[56] References Cited

U.S. PATENT DOCUMENTS

| 2,775,758 | 12/1956 | Munz | 342/179 |
|---|---|---|---|
| 4,041,476 | 8/1977 | Swainson | 365/119 |

(List continued on next page.)

FOREIGN PATENT DOCUMENTS

| 250121 | 12/1987 | European Pat. Off. |
| 322257 | 6/1989 | European Pat. Off. |
| 426363 | 5/1991 | European Pat. Off. |
| 2583333 | 12/1986 | France |
| 2583334 | 12/1986 | France |
| 5-11751B | 2/1993 | Japan |
| 1556451 | 11/1979 | United Kingdom |

OTHER PUBLICATIONS

Wohlers, T. *Cadence*, Plastic Models in Minutes, pp. 101–104 (Jul. 1990).
*Production*, No–Mess Modeling in Minutes, p. 16 (Aug. 1990).
Kodama, H. *Review of Scientific Instruments*, Automated Method for Fabricating a Three-Dimensional Plastic Model with Photohardening Polymer, vol. 52, no. 11, pp. 1770–1773 (Nov. 1981).
*Flexible Automation*, Stratysys Makes 3D Models in Minutes, pp. 6–7 (Jul. 1990).
Herbert, A. J. *Journal of Applied Photographic Engineering*, Solid Object Generation, vol. 8, no. 4, pp. 185–188 (Aug. 1992).
Translation Of Japan 3–236,940 (Published Oct. 22, 1991).

*Primary Examiner*—Leo B. Tentoni
*Attorney, Agent, or Firm*—Dennis R. Smalley

[57] ABSTRACT

Apparatus for and related methods of forming three-dimensional objects out of a building material, which is normally solid, but which is flowable when heated. In one embodiment, a support material is used to fill in portions of layers which are not to be solidified as part of the object, thus providing support to otherwise unsupported portions of other layers. Advantageously, the support material is also normally solid and flowable when heated, and has a lower melting point than the building material enabling the support material to later be removed without damaging the object. In an alternative embodiment this support material can be used to build a support such as a web support, or the like, for supporting an object surface from a second surface. In another alternative embodiment, such an apparatus is combined with a conventional stereolithographic apparatus to provide means for forming an object out of conventional stereolithographic materials, but utilizing a normally solid but thermally-flowable support material to provide support to the object, either on a layer-by layer basis, or by building supports such as web supports.

31 Claims, 1 Drawing Sheet

U.S. PATENT DOCUMENTS

| | | | |
|---|---|---|---|
| 4,247,508 | 1/1981 | Householder | 264/219 |
| 4,575,330 | 3/1986 | Hull | 425/174.4 |
| 4,665,492 | 5/1987 | Masters | 364/468 |
| 4,749,347 | 6/1988 | Valavaara | 425/135 |
| 4,752,498 | 6/1988 | Fudim | 427/510 |
| 4,801,477 | 1/1989 | Fudim | 427/510 |
| 4,942,060 | 7/1990 | Grossa | 427/553 |
| 4,961,154 | 10/1990 | Pomerantz et al. | 395/119 |
| 4,999,143 | 3/1991 | Hull et al. | 264/401 |
| 5,031,120 | 7/1991 | Pomerantz et al. | 364/468 |
| 5,059,266 | 10/1991 | Yamane et al. | 156/64 |
| 5,121,329 | 6/1992 | Crump | 364/468 |
| 5,126,529 | 6/1992 | Weiss et al. | 264/221 X |
| 5,134,569 | 7/1992 | Masters | 364/474.24 |
| 5,136,515 | 8/1992 | Helinski | 364/468 |
| 5,140,937 | 8/1992 | Yamane et al. | 118/695 |
| 5,141,680 | 8/1992 | Almquist et al. | |
| 5,216,616 | 6/1993 | Masters | 364/474.24 |
| 5,340,433 | 8/1994 | Crump | 156/578 |

THERMAL STEREOLITHOGRAPHY

This application is a continuation of U.S. patent application Ser. No. 08/337,336 filed on Nov. 9, 1994, now abandoned; which is a continuation of U.S. patent application Ser. No. 08/148,544 filed on Nov. 8, 1993, now U.S. Pat. No. 5,501,824; which is a continuation of U.S. patent application Ser. No. 07/900,001 filed Jun. 17, 1992, now abandoned; which is a continuation of U.S. patent application Ser. No. 07/592,559 filed on Oct. 4, 1990, now U.S. Pat. No. 5,141,680, which is a continuation-in-part of Ser. No. 182,801, filed Apr. 18, 1988, now U.S. Pat. No. 4,999,143.

BACKGROUND OF THE INVENTION

I. Field of the Invention

This invention relates generally to the stepwise layer by layer formation of a three-dimensional object through application of the principles of stereolithography, and more specifically, to the formation of such an object utilizing materials which are normally solid, but which are made flowable upon the application of thermal radiation.

II. Background of the Invention

Several model building techniques have recently become available for building three-dimensional objects in layers. One such technique is stereolithography, which is described in U.S. Pat. Nos. 4,575,330 and 4,929,402 (hereinafter the '330 and the '402 patents), the disclosures of which are hereby fully incorporated by reference herein as though set forth in full. According to the principles of stereolithography, a three-dimensional object is formed layer by layer in a stepwise fashion out of a material capable of physical transformation upon exposure to synergistic stimulation. In one embodiment of stereolithography, layers of untransformed material such as liquid photopolymer or the like are successively formed at the working surface of a volume of the liquid photopolymer contained in a container. The untransformed layers are successively formed over previously-transformed material. The process of forming these untransformed layers is known as a recoating step, and is described in detail in U.S. Pat. No. 5,174,931.

Upon formation, the untransformed layers are selectively exposed to synergistic stimulation such as UV radiation, or the like, whereupon they form object layers. Moreover, upon transformation into the object layers, the untransformed layers typically adhere to the previously-formed layers through the natural adhesive properties of the photopolymer upon solidification. Additional details about stereolithography are available in the following U.S. Patents and co-pending patent applications, all of which, including appendices, are hereby fully incorporated by reference herein as though set forth in full:

| Ser. No. | Date | Inventor(s) | Status |
|---|---|---|---|
| U.S. 182,830 | 4/18/88 | Hull et al. | U.S. Pat. No. 5,059,359 |
| U.S. 183,016 | 4/18/88 | Modrek | U.S. Pat. No. 4,996,010 |
| U.S. 182,801 | 4/18/88 | Hull et al. | U.S. Pat. No. 4,999,143 |
| U.S. 183,015 | 4/18/88 | Smalley | U.S. Pat. No. 5,015,424 |
| U.S. 268,429 | 11/8/88 | Modrek et al. | U.S. Pat. No. 5,076,974 |
| U.S. 268,837 | 11/8/88 | Spence et al. | U.S. Pat. No. 5,123,734 |
| U.S. 268,816 | 11/8/88 | Spence | U.S. Pat. No. 5,058,988 |
| U.S. 268,907 | 11/8/88 | Spence et al. | U.S. Pat. No. 5,059,021 |
| U.S. 331,644 | 3/31/89 | Hull et al. | U.S. Pat. No. 5,184,307 |
| U.S. 339,246 | 4/7/89 | Hull et al. | U.S. Pat. No. 5,140,592 |
| U.S. 429,435 | 10/30/89 | Smalley et al | U.S. Pat. No. 5,130,064 |
| U.S. 365,444 | 6/12/89 | Leyden et al. | U.S. Pat. No. 5,143,663 |
| U.S. 427,885 | 10/27/89 | Spence et al. | U.S. Pat. No. 5,133,987 |
| U.S. 429,911 | 10/27/89 | Spence et al. | U.S. Pat. No. 5,182,056. |

In conventional embodiments of a stereolithographic apparatus, the material used is normally flowable so that it can be disposed onto a working surface in preparation for exposure to the synergistic stimulation. Conventional materials which are typically used are photopolymers which solidify upon exposure to UV radiation from a UV laser or the like.

The use of these conventional materials is sometimes problematic, since they can be toxic when placed in contact with the skin, and are also difficult to dispose of easily. The use of UV radiation from UV lasers is also sometimes problematic because of the potential injury to the human eye. As a result, the use of this radiation must be controlled, and precautions taken, to minimize the risk of eye injury. Moreover, the time required for the photopolymers to solidify upon exposure to the UV radiation can be prohibitively long. Finally, these materials are typically very viscous, so that the time required to form a fresh layer of material over the working surface in anticipation of the formation of the next object cross-section can be prohibitively long.

Another problem with conventional stereolithographic apparatus is the difficulty of rapidly substituting materials throughout the part-building process, which would enable different portions of the same part to be formed out of different materials having different properties such as color, conductivity, and the like. Rapid material substitution is difficult in a conventional stereolithography apparatus, since the material used to build the part is typically contained in a container, and it is difficult or time-consuming to be able to substitute different containers throughout part building.

Rapid material substitution, however, would be beneficial. When building part supports, such as web supports described in U.S. Pat. No. 4,999,143, for example, the ability to use a different material for the supports compared with the part would be desirable, because the supports could then be constructed out of a material which could more easily be removed from the part after the part has been built, without damage to the part. At present, in conventional stereolithographic apparatus, the same material is used to build the supports, causing them to adhere strongly to the part. As a result, the subsequent removal of the supports can lead to ripping or tearing of the part.

Consequently, it is an object of the subject invention to provide an apparatus of and method for providing three-dimensional objects through the principles of stereolithography, but which employ the use of normally solid materials which are made flowable upon the application of thermal radiation such as heat. It is a further object to provide such an apparatus which can be coupled to a conventional stereolithographic apparatus. It is a further object to provide a stereolithographic apparatus which enables rapid substitution of materials throughout part building. It is a further object to provide a stereolithographic apparatus for and method of forming three-dimensional objects which enable the use of a different support material from the material used to build the part, which support material is chosen so that it is easily removable from the part.

Additional objects and advantages will be set forth in the description which follows or will be apparent to those or ordinary skill in the art who practice the invention.

SUMMARY OF THE INVENTION

To achieve the foregoing objects, and in accordance with the purpose of the invention as broadly described herein, there is provided apparatus for and related methods of forming a three-dimensional object, comprising: a frame; a container of a material which is normally in a solid state, and which is flowable when subjected to synergistic stimulation; first means for applying said synergistic stimulation to the material in the container whereupon the material in the container is caused to be flowable; a nozzle coupled to the container for dispensing the flowable material from the container through an outlet in the nozzle; second means responsive to control signals for controlling the flow of flowable material dispensed by the nozzle; a movable platform; translation means responsive to control signals fixed to the frame for translating the nozzle to a predetermined position relative to the movable platform; and at least one control computer for sending control signals to the second means, and the translation means, to apply the synergistic stimulation to the material to obtain flowable material and to selectively dispense the flowable material to form said three-dimensional object substantially layer-by-layer.

DESCRIPTION OF THE PREFERRED EMBODIMENT

Figure 1:
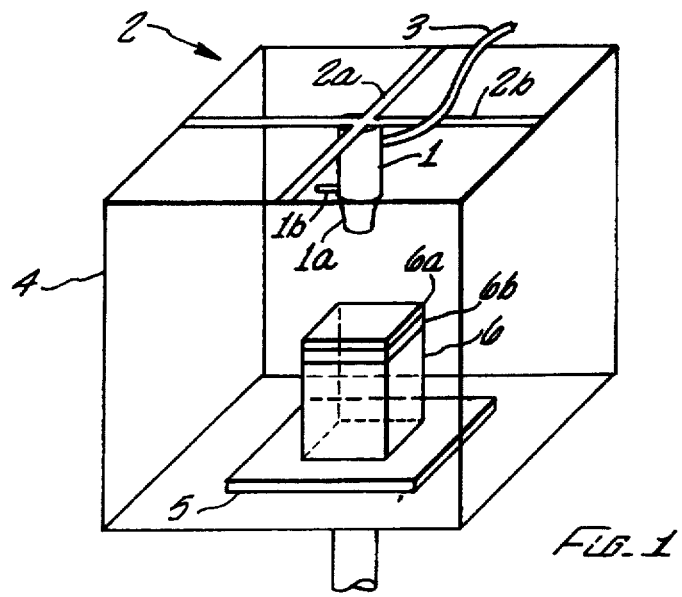
FIG. 1 illustrates one embodiment of an apparatus of the subject invention wherein a part is built from a normally solid material which is made flowable upon being heated.

An embodiment of the apparatus of the subject invention is illustrated in FIG. 1. As illustrated, the apparatus comprises dispensing nozzle 1, x-y translation means 2, flexible tube 3, frame 4, and movable platform 5. The dispensing nozzle is coupled to the x-y translation means, which, in turn, is coupled to the frame. The x-y translation means is capable of moving the nozzle to any x, y position within a plane, as shown. An example of a translation table is that available from Daedal, Inc., Harrison City, Pa. The nozzle is advantageously coupled to a source of material (not shown) by means of flexible tube 3, which provides material from the source to the dispensing nozzle. The platform 5 is advantageously coupled to a z-stage elevator (not shown), which is coupled to the frame, and is capable of moving the platform in the z-dimension relative to the frame. The x, y, and z dimensions are indicated in the figure. The z-stage elevator and the x-y translation means are advantageously coupled to a control computer, which, in turn, is advantageously coupled to a CAD system or the like. The translation means is capable of moving the nozzle to any x, y position within a plane in response to control signals, and the z-stage elevator, also in response to control signals, is capable of moving the platform to any position in the z-dimension along a path substantially perpendicular to the plane. Together, the translation means and the z-stage elevator provide a capability to selectively dispense material to any selected position on the platform, as well as to positions on a partially-formed part above the platform in the course of building up the part.

The dispensing nozzle is advantageously fitted with removable tip 1a having an outlet of a particular size. The size of the outlet can be determined based on the particular application, and a tip with the appropriate size outlet can then be fitted to the nozzle. The size of the outlet determines the resolution of the final part. For parts where high resolution is not required, a tip with a relatively large outlet can be used, while for other parts, where high resolution is important, a tip with a small outlet can be used. Alternatively, different tips can be used throughout the building of a single part. For example, a tip with a small outlet could be used to form the boundaries of a part, where high resolution might be required, while a tip with a larger outlet could be used to rapidly fill in the areas within the boundaries.

As shown, the nozzle is advantageously coupled to a source of material by means of flexible tube 3. Preferably, the material is a material which is normally solid at room temperature, but which is rendered flowable when heated above its melting point. Possible materials include thermoplastics, hot-melt glue, wax, and cerro alloys (which typically have melting temperatures ranging from 150 to 340 degrees Fahrenheit). After it is dispensed, the material should be viscous enough to stay in place until it solidifies. In addition, it must be thin enough to be dispensed through the outlet.

The material is advantageously heated above its melting temperature at the source to render it flowable by means of a heater or the like (not shown). The material, once melted, will flow from the source to the nozzle by means of flexible tube 3. Alternatively, the source (and the heater) could be integrated with the nozzle, and the tube could then be eliminated. In this instance, both the integrated source and nozzle would be coupled to and movable by the x-y translation means.

When the material is relatively viscous, or the outlet of the nozzle relatively small, the material can be dispensed through the nozzle upon the application of pressure from a source (not shown). Air pressure is preferable, but an alternative form includes mechanical pressure as developed with a piston-type plunger. When the material is less viscous, or the outlet of the nozzle is larger, the material can be dispensed through the force of gravity.

The flow of material can be stopped by means of slidable valve 1b, in response to control signals, to physically block the flow. Alternatively, in those instances where flow has been initiated by pressure, the flow can be stopped by lessening, ceasing, or reversing the pressure. During part-building, it may be advantageous to periodically block the flow of material after a cross-section has been formed to give the material making up that cross-section time to solidify. Then, the flow could be allowed to continue, and the material disposed to form the next cross-section.

In operation, the apparatus can be used to build a part as follows. First, a representation of the part is optionally provided to the control computer from a CAD system or the like. The control computer then slices the object representation into a plurality of layer representations collectively known as a building representation. The control computer then simultaneously directs the x-y movement of the nozzle and the z-movement of the platform in accordance with the building representation to selectively dispense material at the appropriate areas to form the part. First, material will be directly dispensed onto the platform. Then, as part building continues, the material from a cross-section will be dispensed onto a previous cross-section.

In practice, as described in U.S. Pat. No. 5,184,307, the control computer can comprise several computers, including a SLICE computer for slicing the object representation into a building representation, and a PROCESS computer for sending control signals to and directing movement of the x-y translation means and z-stage elevator, and for controlling the flow of material through the nozzle.

In FIG. 1, cross-section 6b is formed by moving the platform until the previous cross-section is situated an appropriate vertical distance below the nozzle. Then, in accordance with the building representation, an appropriate volume of material is dispensed from the nozzle in accordance with the layer thickness prescribed by the building representation, while the nozzle is moved to the appropriate x, y locations on the working surface (which may either be the platform or a previous cross-section) in accordance with the prescribed pattern for the cross-section specified by the building representation.

After the material for the cross-section has been dispensed, it will then cool and harden into the next cross-section, and simultaneously adhere to the working surface, advantageously through the natural adhesive properties of the material as it cools. Alternatively, a pressure or heat-sensitive adhesive could be applied to ensure even greater adhesion.

The flow of material is then blocked, the platform lowered, and the next cross-section 6a formed in the manner previously described. In this manner, the final part 6 is formed, cross-section by cross-section, according to the general principles of stereolithography.

After the part has been formed, it can be removed from platform 5 by heating the platform, thereby melting the thin layer of material bonding the part to the platform. Alternatively, this bond can be broken by sawing or cutting.

An advantageous aspect of this embodiment is the ability to rapidly change materials which are dispensed through the nozzle. This can simply be accomplished by substituting one source of material for another by simply connecting the remote end of flexible tube 3 to a different source. Alternatively, many different sources can be coupled to the nozzle through their own respective tubes, the control of the flow of material from each source to the nozzle being controlled by a slidable valve or other means for each tube, as previously described.

After a cross-section has been formed out of a first material, for example, it may be advantageous to fill the hollow areas on that cross-section with a second material in order to provide support for portions of the next cross-section. The second material can be chosen such that it can easily be removed from the final part after building is complete. One way to accomplish this is to employ a second material which has a lower melting point than the material used to built the part.

Figure 2:
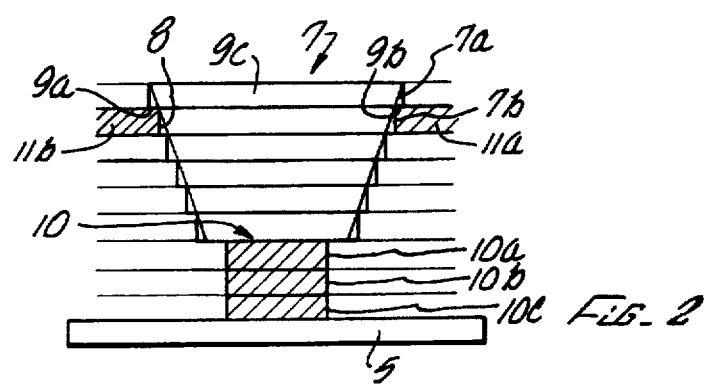
FIG. 2 illustrates the use of a second such material to provide support to otherwise unsupported portions of cross-sections.

In FIG. 2, for example, part 7 is illustrated. The object representation used to construct the part is identified with reference numeral 8, and the cross-sections of the built part are denoted by numerals 7a, 7b, etc. As indicated, in this example, the part is built in an oversized style relative to the object representation.

As shown, each of the part layers will have some unsupported portions. The portions of cross-section 7a which are unsupported will be portions 9a and 9b.

These unsupported portions may be problematic, especially since the material may not harden immediately upon leaving nozzle 1, but instead may, for a time, remain flowable after it has been deposited. In this instance, especially if the unsupported sections are in the shape of a cantilevered beam or the like, the unsupported portions may collapse unless means are provided to support the unsupported portions, at least until the material making up these portions has solidified enough so that these portions will support themselves.

An advantageous way to provide support is by dispensing a second support material in the appropriate regions on the previous cross-section in order to support the unsupported portions of the next cross-section. In FIG. 2, for example, cross-hatched areas 11a and 11b might be filled with a support material in order to support portions 9a and 9b.

This support material, like the building material used to build the part, can have the properties of being normally solid, of being flowable upon being heated, and then solidifying after it is being dispensed from the nozzle. However, the support material should have the property of being easily separable from the part at a later stage of processing. As mentioned previously, one way to accomplish this by utilizing a support material which has a lower melting point than the building material.

The support material is preferably wax, a thermoplastic, hot melt glue (such as that dispensed from a hot melt glue gun), a metal having a lower melting point than the first material, a powder, or a liquid of higher density than the first material and which does not bond to it. Possible liquids include heavy water, a fluorocarbon, heavy FREON (a chlorofluorocarbon), ethylene glycol, or salt water. Advantageously, the support material should be a good thermal conductor. This property will speed up the time it takes for the building material to solidify after it has been dispensed, since it will facilitate the conduction of heat away from this material.

To provide support to the next cross-section, the hollow areas in a particular cross-section which are not to be solidified into the final part (hereinafter referenced to as the "void" or "hollow" areas) can be filled with the support material. As discussed previously, this can be accomplished simply by changing the source of the material coupled to the nozzle.

Also, as discussed previously, the building material is normally a solid at room temperature. Alternatively, if the part 6, while it is being formed, is kept below room temperature, a building material can be used which is a liquid at room temperature, as long as the part is kept below the freezing point of the material, so that the building material will solidify upon contacting the partially-formed part.

The speed with which this material, after it has been dispensed, will solidify, depends on the thermal conductivity of the immediate environment surrounding the material after it has been dispensed. This environment will typically include the previous cross-section, any support material from the previous cross-section, and the air. As a result, it will be advantageous to keep the already-formed cross-sections and support material substantially below the melting point of the building material in order to speed up the solidification process.

In the case where a thermally-flowable support material is used which solidifies after it is dispensed, it is advantageous to utilize a support material having a lower melting point than the building material. This property will enable the support material, after it has solidified, to simply be melted off of the part without damaging it. This separation can be accomplished after the next cross-section has been solidified, since this cross-section would then no longer need support. Alternatively, separation can be effectuated after the entire part has been built.

The support material, after it has been dispensed, should be maintained below its melting point, even after it is placed in contact with just-dispensed building material, which will typically still be hot. Otherwise, the support material will melt when it is placed in contract with the just-dispensed building material.

To accomplish this, a support material should be used which has a high enough thermal conductivity so that it does not melt when placed in contact with the building material. Alternatively, if the temperature of the support material is kept low enough, it may not have to be a good thermal conductor providing it has a high enough heat capacity at the interface with the building material so that it does not melt.

In some cases, it may be desirable to use a support material having a higher melting temperature than the building material since this will facilitate the creation of hollow molds or the like, which can subsequently be used to produce the part on a production scale.

In FIG. 2, for example, the hollow areas in all the cross-sections can be filled in with such a support material. Then, after the part has been formed, the building material could be melted and drained off without damaging the solidified support material.

Additional elements could be added to cool the building material as it exits the nozzle. For example, a hose (not shown) can be situated near the nozzle outlet to divert a spray of air or water mist towards the material as it is being dispensed. Alternatively, a gas or a liquid having a lower density than the building material, and hence capable of absorbing heat from the building material, can be directed towards the nozzle.

Alternative means of providing support other than the use of support material to fill hollow areas in object cross-sections can be utilized. One alternative approach comprises altering the order in which the building material on a cross-section is dispensed. Instead of simply dispensing the material from one side of the cross-section to the other, this approach comprises first dispensing the material to those portions of the cross-section which are supported, and then radially extending those cross-sections to include the unsupported portions. In FIG. 2, for example, for the building of cross-section 6b, building material might initially be dispensed at point 9c, and then be extended radially to include portions 9a and 9b. Provided that the unsupported portions 9a and 9b are not too large, support will be provided to them by the supported portion A third approach to providing support is the use of a support material to actually build supports, such as web supports, as described in U.S. Pat. No. 4,999,143. Such a support material would have all the properties discussed previously, e.g., it would preferably have a lower melting point than the building material so that it could later be separated from the part without damaging the part. FIG. 2 illustrates web support 10 which spaces the part 7 from the platform 5, and which also supports the part from the bottom surface. As discussed in U.S. Pat. No. 4,999,143, web supports could also be used to support portions of a part other than the bottom surface, such as a cantilevered surface. These surfaces could be supported by a web support connecting the surface to the platform, or alternatively, to another part surface. The web support in FIG. 2 is comprised of three cross-sections, numbered 10a, 10b, and 10c, each of which could be formed using the support material in the manner described previously.

It is advantageous to be able to incorporate the teachings of the subject invention into a conventional stereolithography apparatus, i.e., one employing a container of a material capable of physical transformation upon selective exposure to synergistic stimulation such as a polymerizable resin which solidifies upon a UV laser beam, a recoating means such as a z-stage elevator, and means such as a doctor blade or the like to rapidly coat fresh layers of resin over previous cross-sections.

Figure 3:
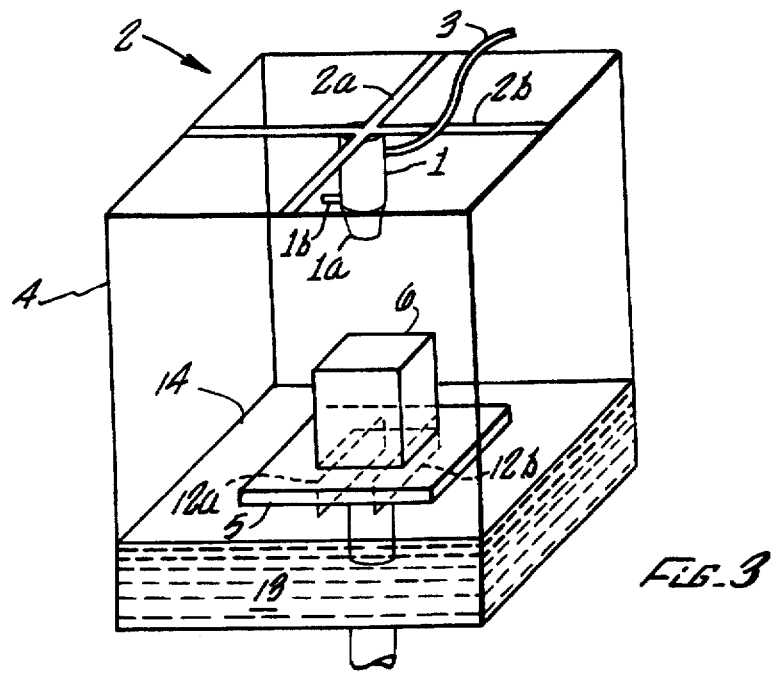
FIG. 3 illustrates a second embodiment of an apparatus of the subject invention comprising the apparatus of FIG. 1 coupled to a conventional stereolithographic apparatus.

An apparatus which incorporates these teachings is illustrated in FIG. 3, in which, compared to FIG. 1, like elements are referred to with like reference numerals. The additional elements in FIG. 3 not previously discussed are container 13 containing a material capable of physical transformation upon selective exposure to synergistic stimulation, such as a polymerizable resin which solidifies upon exposure to UV radiation, a doctor blade (not shown), a source of synergistic stimulation such as a UV laser (not shown) which emits a UV laser beam, and rotatable scanning mirrors (not shown) capable of directing the UV laser beam to a point on the material surface 14. Part 6 is shown as being formed, and spaced from platform 5, by already-formed web supports 12a and 12b. The platform, as before, is coupled to a z-stage elevator (not shown), which is capable of raising the platform into and out of the container of material, below the material surface if necessary, and also to a position proximate to nozzle 1.

Each cross-section of the supports 12a and 12b, and the part 6, can be formed from a material dispensed through the nozzle, or from material contained in the container. Material from the nozzle will be selectively dispensed in the manner previously described. Fresh material from the container will not be selectively dispensed, but instead will be recoated over the platform or previous cross-section in the conventional manner, i.e., by overdipping the platform or previous cross-section below the material surface, whereupon a fresh layer of material flows over the platform or previous cross-section, and then up-dipping the upper surface of the fresh layer of material above the material surface, whereupon excess resin is swept away by the doctor blade. After recoating, the fresh layer of material is then typically selectively exposed to the synergistic stimulation.

Many building methods are possible with this apparatus. For example, web supports could be formed out of normally solid, thermally-flowable material dispensed from the nozzle, and the part could be formed out of a material capable of selective physical transformation upon exposure to synergistic stimulation, which is contained in a container. Moreover, the hollow areas of the cross-sections could be filled in with the normally-solid, thermally-flowable material dispensed from the nozzle to provide even additional support.

In this instance, part formation would proceed as follows. First, support material in the nozzle would be selectively dispensed onto the platform or previous cross-section in those areas which will not be part of the final part, and then allowed to solidify. In FIG. 2, for example, this material would be dispensed in areas 11a and 11b of cross-section 7b. This material would not be dispensed into the areas on the cross-section which are to solidify into the final part. After this support material has solidified, a mold in the shape of the part cross-section will be formed. Then, the platform and the upper surface of this solidified support material could be down-dipped deeply below material surface 14, causing fresh building material from the container to flow into those areas on the cross-section which are to be solidified into the final part. In FIG. 2, for example, deep down-dipping will cause area 9c to fill with the building material from the container. The platform could then be up-dipped and the doctor blade or the like utilized to sweep away any excess material. Next, this building material would be selectively exposed to the synergistic stimulation in the conventional manner, i.e., by rotating the mirrors to trace the beam along the surface of this material in a prescribed pattern. Alternatively, this material could be flood-exposed to the synergistic stimulation. Flood exposure rather than selective exposure is possible since any excess material has already been removed which could conceivably be improperly solidified. This has been accomplished by the action of the doctor blade, but also by the previous step of dispensing the normally solid, thermally-flowable support material to effectively form a mold of the part cross-section. This latter step ensures that little or no excess material from the container will be present in these areas which could be improperly solidified.

This process could continue for the formation of the next cross-section. The support material could then be removed in the manner previously described.

Note that by dispensing the support material before recoating with the building material ensures that excess support material will not solidify over those portions of the solidified building material which will be adhered to adjacent part cross-sections. As a result, a machining step whereby any such excess support material would need to be machined off in order to ensure adherence is eliminated.

Alternatively, it may be advantageous to add a machining step before recoating with the building material in order to smooth the solidified support material. This might facilitate the flow of building material over the solidified support material, and may even facilitate sweeping with the doctor blade or the like, during the recoating step. To avoid any damage to the solidified material during the recoating step, it may be advantageous to perform sweeping with a squeegee rather than a doctor blade.

In the above description, the support material is the normally-solid thermally-flowable material selectively dispensed from the nozzle, and the building material is the material in the container capable of selective physical transformation upon exposure to the synergistic stimulation. Alternatively, one of ordinary skill may appreciate that the support structure, whether web supports or layer-by-layer support, could be formed out of the material in the container, and the part could be formed out of the material dispensed from the nozzle.

While embodiments and applications of this invention have been shown and described, it should be apparent to those skilled in the art that many more modifications are possible without departing from the inventive concepts herein. Specifically, the invention is intended to encompass stereolithographic part building employing any material which is normally in a solid state and which is flowable when subjected to any form of synergistic stimulation. Included are materials made flowable upon conduction of heat, through application of a probe or the like, or through ion or particle bombardment or the like. Also included are materials made flowable upon application of radiation of heat from a $CO_2$ or infrared laser, or the like. The invention is further intended to encompass materials which are made flowable upon the application of heat through a chemical reaction, such as where heat is released when a first material is placed in contact with a second material, causing the first material to be made flowable, or where the first and second materials are placed in contact with a third material, causing the third material to be made flowable. The invention, therefore, is not to be restricted, except in the spirit of the appended claims.

What is claimed is:

1. A method of forming a three-dimensional object on a layer by layer basis, comprising the steps of:
    supplying cross-sectional data descriptive of layers of the three-dimensional object;
    separately containing a building material and a support material one of which is a selected material and the other of which is an unselected material, wherein the selected material is normally in a solid state and which is made flowable when maintained at a temperature at least as great as a flowable temperature;
    maintaining said selected material at a temperature at least as great as said flowable temperature thereby causing said selected material to be flowable;
    selectively dispensing said flowable selected material in a prescribed pattern, according to said cross-sectional data, into a building environment which is maintained at a temperature below said flowable temperature to form a layer having areas of solidified material;
    applying the unselected material, while in a flowable state, to regions adjacent to said areas of solidified material;
    removing at least one of the selected material or unselected material located above a plane defining a desired upper surface of the layer; and
    repeating the selectively dispensing, applying and removing steps a plurality of times and separating the building and support material to form the three-dimensional object from a plurality of adhered layers.

2. The method of claim 1 wherein the unselected material is flowable when applied and is solidified prior to the step of removing.

3. The method of claim 2 wherein the unselected material is a photopolymer material and wherein said photopolymer is exposed to synergistic stimulation to solidify it.

4. The method of claim 1 wherein the building material is the selected one.

5. The method of claim 1 wherein the support material is the selected one.

6. The method of claim 1 wherein the step of applying the unselected one comprises selectively dispensing the unselected one.

7. The method of claim 1 wherein the selected one is selectively dispensed as a flow of material.

8. The method of claim 1 wherein the removing step comprises a step of sweeping a smoothing member.

9. The method of claim 8 wherein the smoothing member is a squeegee that wipes any unselected one from an upper surface of the solidified regions.

10. The method of claim 1 wherein the step of removing comprises a step of machining.

11. The method of claim 1 wherein the removing step comprises a machining step.

12. An apparatus for forming a three-dimensional object on a layer-by-layer basis, comprising:
    means for supplying cross-sectional data descriptive of layers of the three-dimensional object;
    means for separately containing a building material and a support material, one of which is a selected material and the other of which is an unselected material, wherein the selected material is normally in a solid state and which is made flowable when maintained at a temperature at least as great as a flowable temperature;

means for maintaining said selected material at a temperature at least as great as said flowable temperature thereby causing said selected material to be flowable;

means for selectively dispensing said flowable selected material in a prescribed pattern, according to said cross-sectional data, into a building environment which is maintained at a temperature below said flowable temperature to form a layer having areas of solidified material;

means for applying the unselected material, while in a flowable state, to regions adjacent to said areas of solidified material;

means for removing at least one of the selected material or unselected material located above a plane defining a desired upper surface of the layer; and means for repeatedly operating the means for selectively dispensing, means for applying and means for removing a plurality of times to form the three-dimensional object from a plurality of adhered layers.

13. The apparatus of claim 12 wherein the unselected material is flowable when applied and additionally comprising means for solidifying said unselected material.

14. The apparatus of claim 13 wherein the unselected material is a photopolymer material and the means for solidifying comprises means for exposing said applied photopolymer to synergistic stimulation.

15. The apparatus of claim 12 wherein the means for applying the unselected one comprises means for selectively dispensing the unselected one.

16. The apparatus of claim 12 wherein the means for selectively dispensing dispenses a flow of material.

17. The apparatus of claim 12 wherein the means for removing comprises means for sweeping a smoothing member.

18. The apparatus claim of 17 wherein the smoothing member comprises a squeegee that wipes material from an upper surface of the solidified regions.

19. The apparatus of claim 12 wherein the means for removal comprises a means for machining.

20. The apparatus of claim 12 wherein the means for removing comprises a means for machining.

21. The method of claim 11 wherein the step of separately containing comprises containing at least one building material and at least one support material and wherein the unselected material is contained in a flowable state.

22. The method of claim 1 wherein the step of removing smooths the regions of solidified material.

23. The method of claim 2 wherein the step of removing smooths the regions of solidified material.

24. A method of forming a three-dimensional object on a layer-by-layer basis, comprising the steps of:

supplying cross-sectional data descriptive of layers of the three-dimensional object;

separately containing at least one building material and at least one support material, one of which is a selected material and the other of which is an unselected material, wherein the selected material is normally in a solid state and which is made flowable when maintained at a temperature at least as great as a flowable temperature, and the unselected material is contained in a flowable state;

maintaining said selected material at a temperature at least as great as said flowable temperature thereby causing said selected material to be flowable;

selectively dispensing said flowable selected material in a prescribed pattern, according to said cross-sectional data, into a building environment which is maintained at a temperature below said flowable temperature to form a layer having areas of solidified material;

applying the unselected material to regions adjacent to said areas of solidified material;

removing at least one of the selected or unselected material located above a plane defining a desired upper surface of the layer;

repeating the selectively dispensing, applying and removing steps a plurality of times to form the three-dimensional object; and separating the building and support material.

25. The apparatus of claim 12 wherein the means for separately containing comprises containing at least one building material and at least one support material wherein the unselected material is contained in a flowable state.

26. The apparatus of claim 12 wherein the means for removing material additionally comprises means for smoothing the areas of solidified material.

27. The apparatus of claim 13 wherein the means for removing material additionally comprises means for smoothing the areas of solidified material.

28. An apparatus for forming a three-dimensional object on a layer-by-layer basis, comprising:

means for supplying cross-sectional data descriptive of layers of the three-dimensional object;

means for separately containing at least one building material and at least one support material, one of which is selected material and the other of which is an unselected material, wherein the selected material is normally in a solid state and which is made flowable when maintained at a temperature at least as great as a flowable temperature, and the unselected material is contained in a flowable state;

means for maintaining said selected material at a temperature at least as great as said flowable temperature thereby causing said selected material to be flowable;

means for selectively dispensing said flowable selected material in a prescribed pattern, according to said cross-sectional data, into a building environment which is maintained at a temperature below said flowable temperature to form a layer having areas of solidified material;

means for applying the unselected material to regions adjacent to said areas of solidified material;

means for removing at least one of the selected material or unselected material located above a plane defining a desired upper surface of the layer;

means for repeatedly operating the means of selectively dispensing, applying and removing a plurality of times to form the three-dimensional object; and means for separating the building and support material.

29. The method of claim 8 wherein the smoothing member comprises a doctor blade.

30. The apparatus of claim 17 wherein the smoothing member comprises a doctor blade.

31. A method of forming a three-dimensional object on a layer-by-layer basis, comprising the steps of:

supplying cross-sectional data descriptive of layers of the three-dimensional object;

containing at least one building material, wherein the building material is normally in a solid state and which is made flowable when maintained at a temperature at least as great as a flowable temperature;

maintaining the building material at a temperature at least as great as the flowable temperature thereby causing the building material to be flowable;

selectively dispensing the flowable building material in a prescribed pattern, according to the cross-sectional data, into a building environment which is maintained at a temperature below the flowable temperature to form a layer having areas of solidified material;

repeating the selectively dispensing and removing steps a plurality of times to form the three-dimensional object from a plurality of adhered layers; and periodically removing the building material located beyond a desired surface level of at least some layers.

* * * * *